(12) United States Patent
Kim

(10) Patent No.: US 12,369,357 B2
(45) Date of Patent: Jul. 22, 2025

(54) THIN FILM TRANSISTOR, AND DISPLAY DEVICE COMPRISING THE SAME

(71) Applicant: LG Display Co., Ltd., Seoul (KR)

(72) Inventor: SeungJin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 476 days.

(21) Appl. No.: 17/901,534

(22) Filed: Sep. 1, 2022

(65) Prior Publication Data
US 2023/0077265 A1 Mar. 9, 2023

(30) Foreign Application Priority Data

Sep. 3, 2021 (KR) .................. 10-2021-0117928
Dec. 28, 2021 (KR) .................. 10-2021-0189918

(51) Int. Cl.
| | |
|---|---|
| H01L 27/32 | (2006.01) |
| H01L 29/786 | (2006.01) |
| H10D 30/67 | (2025.01) |
| H10D 62/80 | (2025.01) |
| H10D 99/00 | (2025.01) |
| H10K 59/126 | (2023.01) |

(52) U.S. Cl.
CPC ..... *H10D 30/6755* (2025.01); *H10D 30/6757* (2025.01); *H10D 62/80* (2025.01); *H10D 99/00* (2025.01); *H10K 59/126* (2023.02)

(58) Field of Classification Search
CPC ............... H10D 30/6755; H10D 30/67; H10D 30/6757; H10D 30/6708; H10D 30/6715; H10D 62/80; H10D 62/85; H10D 62/402; H10D 99/00; H10K 59/126; H10K 59/1213; H10K 59/131; H10K 59/122
See application file for complete search history.

(56) References Cited

U.S. PATENT DOCUMENTS

| | | | |
|---|---|---|---|
| 8,669,556 B2 * | 3/2014 | Yamazaki ............ | H10D 62/235 257/77 |
| 10,529,806 B2 | 1/2020 | Kim et al. | |
| 11,177,449 B2 * | 11/2021 | Sung ................. | H10D 30/6755 |
| 2012/0138922 A1 * | 6/2012 | Yamazaki .......... | H10D 30/6756 257/43 |
| 2016/0300950 A1 | 10/2016 | Lee et al. | |
| 2020/0194699 A1 * | 6/2020 | Sung ...................... | H10K 71/10 |
| 2021/0343972 A1 * | 11/2021 | Zheng ................... | G06F 3/0412 |
| 2022/0384526 A1 | 12/2022 | Yamazaki et al. | |

FOREIGN PATENT DOCUMENTS

| | | |
|---|---|---|
| KR | 20080074515 A | 8/2008 |
| KR | 10-2016-0120394 A | 10/2016 |
| KR | 20180078837 A | 7/2018 |
| KR | 20200073130 A | 6/2020 |
| TW | 201824224 A | 7/2018 |
| TW | 202119380 A | 5/2021 |

\* cited by examiner

*Primary Examiner* — Nikolay K Yushin
(74) *Attorney, Agent, or Firm* — SEED IP LAW GROUP LLP

(57) ABSTRACT

A thin film transistor, a fabricating method of the thin film transistor and a display device comprising the thin film transistor are provided. The thin film transistor comprises an active layer and a gate electrode spaced apart from the active layer and at least partially overlapped with the active layer, wherein the active layer includes a first active layer and a second active layer, which overlap each other, the first active layer includes copper, and the second active layer has mobility higher than that of the first active layer.

20 Claims, 13 Drawing Sheets

THIN FILM TRANSISTOR, AND DISPLAY DEVICE COMPRISING THE SAME

CROSS-REFERENCE TO RELATED APPLICATIONS

This application claims the benefit of priorities of the Korean Patent Application No. 10-2021-0117928 filed on Sep. 3, 2021 and Korean Patent Application No. 10-2021-0189918 filed on Dec. 28, 2021, which are hereby incorporated by reference as if fully set forth herein.

BACKGROUND

Technical Field

The present disclosure relates to a thin film transistor having an active layer containing copper, a fabricating method thereof and a display device comprising the same.

Description of the Related Art

Since a thin film transistor may be fabricated on a glass substrate or a plastic substrate, the thin film transistor has been widely used as a switching element or a driving element of a display device such as a liquid crystal display device or an organic light emitting device.

The thin film transistor may be categorized into an amorphous silicon thin film transistor in which amorphous silicon is used as an active layer, a polycrystalline silicon thin film transistor in which polycrystalline silicon is used as an active layer, and an oxide semiconductor thin film transistor in which oxide semiconductor is used as an active layer, based on a material constituting the active layer.

An oxide semiconductor thin film transistor (TFT), which has a large resistance change in accordance with an oxygen content, has an advantage in that desired properties may be easily obtained. Further, since an oxide constituting an active layer may be grown at a relatively low temperature during a process of fabricating the oxide semiconductor thin film transistor, the fabricating cost of the oxide semiconductor thin film transistor is reduced. In view of the properties of the oxide, since an oxide semiconductor is transparent, it is favorable to embody a transparent display device.

The thin film transistor used as a driving element of the display device is favorable to have a large s-factor to represent a gray scale. Therefore, studies for a thin film transistor used as a driving element of the display device to have a large s-factor will be required.

BRIEF SUMMARY

The present disclosure has been made in view of the above problems and it is an object of the present disclosure to provide a thin film transistor having a large s-factor.

It is another object of the present disclosure to provide a method of improving an s-factor of a thin film transistor by forming a defect state in an active layer.

It is still another object of the present disclosure to provide a thin film transistor having a large s-factor by including an active layer having a defect state.

It is further still another object of the present disclosure to provide a thin film transistor including an active layer having a layer containing copper (Cu).

It is further still another object of the present disclosure to provide a fabricating method of a thin film transistor including an active layer having a layer containing copper (Cu).

It is further still another object of the present disclosure to provide a display device comprising a thin film transistor having a large s-factor to achieve an excellent gray scale representation ability.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising an active layer and a gate electrode spaced apart from the active layer and at least partially overlapped with the active layer, wherein the active layer includes a first active layer and a second active layer, which overlap each other, the first active layer includes copper (Cu), and the second active layer has mobility higher than that of the first active layer.

A concentration of the copper in the first active layer may be uniform.

The copper (Cu) may include at least one of $Cu^+$ or $Cu^{2+}$.

A concentration of $Cu'$ may be higher than that of $Cu^+$.

A ratio of copper based on entire metal elements in the first active layer may be 5 at % or less.

Each of the first active layer and the second active layer may include an oxide semiconductor material.

Each of the first active layer and the second active layer may include indium (In), and a concentration of the indium (In) in the second active layer may be higher than or equal to that of the indium (In) in the first active layer based on the number of atoms.

The first active layer may include indium (In) and gallium (Ga), and a concentration of the gallium (Ga) in the first active layer may be higher than or equal to that of the indium (In) based on the number of atoms.

The first active layer may include zinc (Zn) and gallium (Ga), and when a concentration of the zinc (Zn) included in the first active layer is referred to as "[Zn]1" and a concentration of the gallium (Ga) is referred to as "[Ga]1" based on the number of atoms, $0.8 \leq [Zn]1/[Ga]1 \leq 2$ may be satisfied.

The copper (Cu) may be combined with oxygen (O) to form at least one of CuO or $Cu_2O$.

The active layer may further include a third active layer that is in contact with the second active layer, and the second active layer may be disposed between the first active layer and the third active layer.

The third active layer may include copper (Cu).

The third active layer may not include copper (Cu).

The third active layer may have the same metal composition as that of the first active layer.

In accordance with another aspect of the present disclosure, the above and other objects can be accomplished by the provision of a display device comprising the above thin film transistor.

In accordance with other aspect of the present disclosure, the above and other objects can be accomplished by the provision of a fabricating method of a thin film transistor, comprising forming an active material layer on a substrate; and forming an active layer by patterning the active material layer, wherein the forming the active material layer includes forming a first active material layer and forming a second active material layer, the forming the first active material layer includes a sputtering step, and the first active material layer includes copper (Cu).

The sputtering step may include depositing a raw material, the raw material for forming the first active material layer may include a metal oxide, and the metal oxide may include a copper oxide.

The copper oxide may include a cupric oxide (CuO) and a cuprous oxide ($Cu_2O$).

A content of the CuO may be greater than that of the $Cu_2O$.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
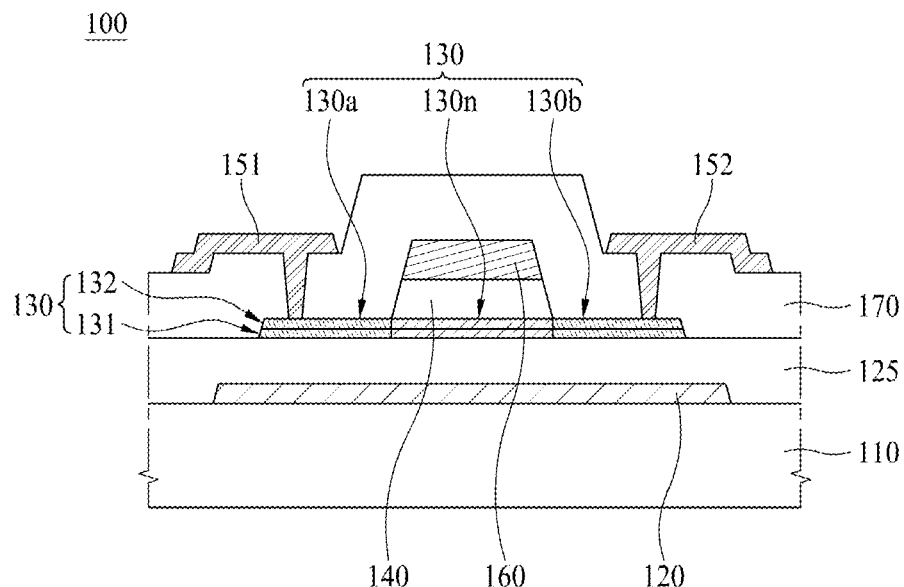
FIG. 1 is a cross-sectional view illustrating a thin film transistor according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when a particular function or configuration is well known to those of skill in the art, the detailed description will be not be provided. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

Spatially relative terms such as "below," "beneath," "lower," "above," and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below," or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin film transistor 100 according to one embodiment of the present disclosure.

Referring to FIG. 1, the thin film transistor 100 according to one embodiment of the present disclosure includes an active layer 130 and a gate electrode 160 spaced apart from the active layer 130 to at least partially overlap the active layer 130. Also, the thin film transistor 100 may include a source electrode 151 and a drain electrode 152. The active layer 130 and the gate electrode 160 are disposed on a substrate 110.

The substrate 110 may include at least one of glass or polymer resin. For example, a glass substrate or a polymer resin substrate may be used as the substrate 110. There is a plastic substrate as the polymer resin substrate. The plastic substrate may include at least one of polyimide (PI), polycarbonate (PC), polyethylene (PE), polyester, polyethylene terephthalate (PET) or polystyrene (PS), which is a transparent polymer resin having flexible properties.

Referring to FIG. 1, a light shielding layer 120 may be disposed on the substrate 110. The light shielding layer 120 has light shielding characteristics. The light shielding layer 120 may shield light incident from the substrate 110 to protect the active layer 130.

The light shielding layer 120 may include metal. The light shielding layer may be made of a single layer, or may have a multi-layered structure.

A buffer layer 125 may be disposed on the light shielding layer 120. The buffer layer 125 covers an upper surface of the light shielding layer 120. The buffer layer 125 has insulation properties and protects the active layer 130. The buffer layer 125 may be referred to as a protective layer or an insulating layer.

The buffer layer 125 may include at least one of silicon oxide (SiOx), silicon nitride (SiNx), hafnium oxide (HfOx), aluminum oxide (AlOx), zirconium oxide (ZrOx), hafnium silicate (Hf-SiOx), or zirconium silicate (Zr-SiOx), which has insulation properties.

Referring to FIG. 1 the active layer 130 may be disposed on the buffer layer 125. The active layer 130 overlaps the light shielding layer 120.

According to one embodiment of the present disclosure, the active layer 130 includes an oxide semiconductor material. According to one embodiment of the present disclosure, the active layer 130 may be an oxide semiconductor layer made of an oxide semiconductor material, for example.

According to one embodiment of the present disclosure, the active layer 130 may include a first active layer 131 and a second active layer 132, which overlap each other. The first active layer 131 and the second active layer 132 may be stacked to form a stacked structure. The first active layer 131 and the second active layer 132 may be in contact with each other.

In more detail, as shown in FIG. 1, an upper surface of the first active layer 131 and a lower surface of the second active layer 132 may be in contact with each other. According to one embodiment of the present disclosure, the upper surface of the first active layer 131 refers to an opposite surface of the substrate 110 among surfaces of the first active layer 131. The lower surface of the second active layer 132 refers to a surface of the second active layer 132, which is directed toward the substrate 110.

According to one embodiment of the present disclosure, each of the first active layer 131 and the second active layer 132 may include an oxide semiconductor material.

The second active layer 132 may have mobility higher than that of the first active layer 131. For example, the second active layer 132 may have mobility higher than that of the first active layer 131 as much as 1.5 times. The term mobility as used herein refers to the mobility of the dominate charge carrier for that particular layer, whether a hole or an electron. In some layers, the dominate charge carrier will be a hole, while in others it will be an electron, depending on the type of doping and other active layer characteristics. In more detail, the second active layer 132 may have mobility of 1.5 to 5 times higher than that of the first active layer 131. In particular, the second active layer 132 may have mobility higher than that of the first active layer 131 as much as two times or more.

According to one embodiment of the present disclosure, the first active layer 131 may include an oxide semiconductor material having relatively low mobility characteristics. For example, the first active layer 131 may include at least one of an IGZO(InGaZnO)-based oxide semiconductor material [Ga concentration≥In concentration], a GZO (GaZnO)-based oxide semiconductor material, an IGO(In-GaO)-based oxide semiconductor material, and a GZTO (GaZnSnO)-based oxide semiconductor material.

Indium (In) increases mobility of an oxide semiconductor, and gallium (Ga) deteriorates mobility. Therefore, when the first active layer 131 includes indium (In) and gallium (Ga), a concentration at % of gallium (Ga) may be set to be higher than or equal to that of indium (In) based on the number of atoms [Ga concentration≥In concentration]. The term at % as used herein has the meaning of atomic % (or atomic %) of that particular element. It refers to the % of atoms of a particular element as compared to 100% of all atoms that make up a particular layer or substance under consideration as the concentration of that element within that layer or substance. According to one embodiment of the present disclosure, the first active layer 131 may include zinc (Zn) and gallium (Ga). Zinc (Zn) is known as improving an etch ratio of the oxide semiconductor layer. On the other hand, gallium (Ga) is known as improving structural stability of the oxide semiconductor layer.

In order to improve etching efficiency of the first active layer 131, a content of zinc (Zn) may be adjusted. When the first active layer 131 includes zinc (Zn) and gallium (Ga), a concentration (at %) of zinc (Zn) may be 0.8 to 2 times the concentration (at %) of gallium (Ga). For example, when the concentration of zinc (Zn) included in the first active layer 131 is "[Zn]1" and the concentration of gallium (Ga) is "[Ga]1," "0.8≤[Zn]1/[Ga]1≤2" may be satisfied.

When the concentration of zinc (Zn) is less than 0.8 times the concentration of gallium (Ga) ([Zn]1/[Ga]1<0.8), etching efficiency of the first active layer 131 may be deteriorated. On the other hand, when the concentration of zinc (Zn) exceeds twice the concentration of gallium (Ga) ([Zn]1/[Ga]1>2), phase segmentation may be generated due to imbalance of stoichiometry.

According to one embodiment of the present disclosure, the second active layer 132 may include an oxide semiconductor material having relatively high mobility characteristics. In one embodiment of the present disclosure, high mobility and low mobility may be relative concepts for comparing the first active layer 131 with the second active layer 132.

The second active layer 132 having high mobility characteristics may serve as a main channel of the thin film transistor 100.

According to one embodiment of the present disclosure, the second active layer 132 may include at least one of an IGZO(InGaZnO)-based oxide semiconductor material, an IZO(InZnO)-based oxide semiconductor material, an IGZTO(InGaZnSnO)-based oxide semiconductor material, an ITZO(InSnZnO)-based oxide semiconductor material, a ZnO-based oxide semiconductor material, a SIZO(SiInZnO)-based oxide semiconductor material or a ZnON(Zn-Oxynitride)-based oxide semiconductor material.

The gallium (Ga) may deteriorate mobility of the oxide semiconductor. Therefore, when the indium-based oxide semiconductor constituting the second active layer 132 includes gallium (Ga), the concentration of indium (In) may be set to be higher than that of gallium (Ga) based on the number of atoms [In Concentration>Ga Concentration].

According to one embodiment of the present disclosure, each of the first active layer 131 and the second active layer 132 may include indium. In this case, based on the number of atoms, the concentration (at %) of indium (In) in the second active layer 132 may be higher than or equal to the concentration (at %) of indium in the first active layer 131. In more detail, based on the number of atoms, the concentration (at %) of indium (In) in the second active layer 132 may be higher than the concentration (at %) of indium (In) in the first active layer 131.

According to one embodiment of the present disclosure, the first active layer 131 includes copper (Cu).

According to one embodiment of the present disclosure, a relatively small amount of copper (Cu) may be present to be uniformly dispersed in the first active layer 131. In more detail, the first active layer 131 may have a structure in which copper (Cu) is uniformly dispersed in the low mobility oxide semiconductor material layer.

In the first active layer 131, copper (Cu) may be present in an ion state. According to one embodiment of the present disclosure, "copper (Cu)" is meant to include both copper atoms and copper ions ($Cu^+$ and $Cu^{2+}$).

According to one embodiment of the present disclosure, copper (Cu) may include at least one of $Cu^+$ or $Cu^{2+}$. The $Cu^+$ or $Cu^{2+}$, which is an ion state, corresponds to copper (Cu) according to one embodiment of the present disclosure. According to one embodiment of the present disclosure, copper (Cu) may include both $Cu^+$ and $Cu^{2+}$.

In the first active layer 131, copper (Cu) may be combined with oxygen (O) or other elements, or may be in the form of an alloy with other metal. In the first active layer 131, copper (Cu) may be combined with oxygen (O) to form at least one of CuO or $Cu_2O$.

When copper (Cu) is combined with oxygen (O), for example, copper (Cu) may be present in $Cu_2O$ or CuO state. When copper (Cu) is present in a $Cu_2O$ state, copper (Cu) may be referred to as a monovalent ion ($Cu^+$) state. When copper (Cu) is present in a CuO state, copper (Cu) may be referred to as a divalent ion ($Cu^{2+}$) state.

In the first active layer 131, a concentration of Cu' may be higher than the concentration of Cut In the first active layer 131, copper (Cu) may be present in a divalent ion ($Cu^{2+}$) state. According to one embodiment of the present disclosure, the concentration of copper (Cu) may be uniform in the first active layer 131. In more detail, the concentration of copper (Cu) may be substantially the same in the entire area of the first active layer 131. In this case, "substantially the same" means a state in which there is no difference in measured values in consideration of occurrence of a measurement error.

According to one embodiment of the present disclosure, in the step of forming the first active layer 131, copper (Cu) may be mixed with other materials, so that the concentration of copper (Cu) may be uniform in the first active layer 131. For example, when the first active layer 131 is formed by sputtering using a metal or a metal oxide as a raw material, sputtering may be performed by uniformly mixing copper (Cu) with the raw material for sputtering, whereby the first active layer 131 in which copper (Cu) is dispersed at a uniform concentration may be formed.

Figure 2:
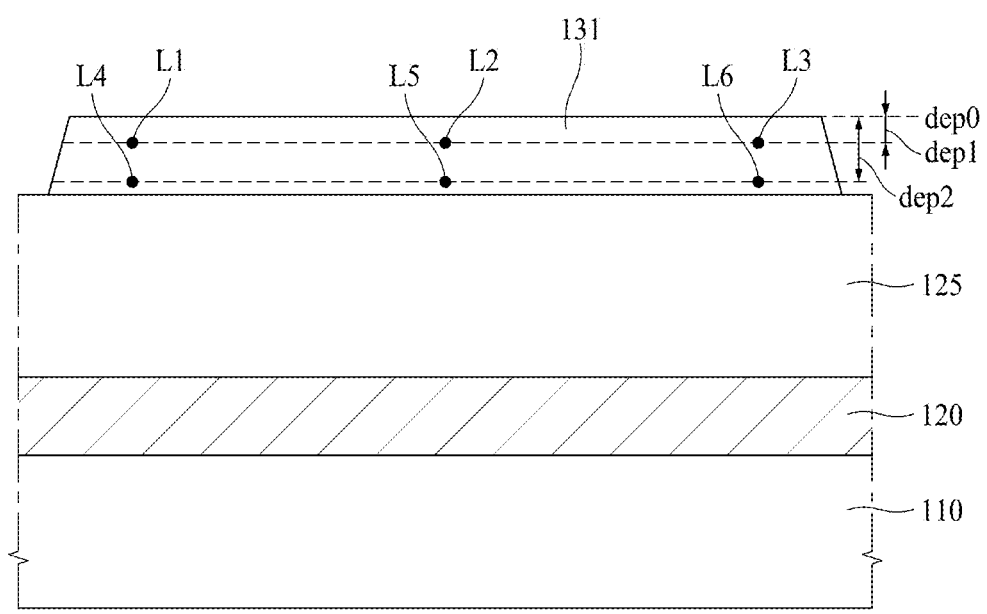
FIG. 2 is a schematic cross-sectional view illustrating a configuration of a first active layer.

FIG. 2 is a schematic cross-sectional view illustrating a configuration of the first active layer 131.

According to one embodiment of the present disclosure, a depth of each portion of the first active layer 131 may be defined as a distance from the upper surface of the first active layer 131 toward the substrate 110.

In FIG. 2, a depth of the upper surface of the first active layer 131 is 0, and is expressed as "dep0." According to one embodiment of the present disclosure, a concentration of copper (Cu) may be uniform at different points on the upper surface of the first active layer 131.

In FIG. 2, a depth of L1, L2 and L3 is dep1. According to one embodiment of the present disclosure, the concentration of copper (Cu) at the points of L1, L2 and L3 is uniform, and may be equal to the concentration of copper (Cu) on the surface. In FIG. 2, a depth of L4, L5 and L6 is dep2. According to one embodiment of the present disclosure, the concentration of copper (Cu) in L4, L5 and L6 is uniform, and may be equal to the concentration of copper (Cu) on the surface.

The concentration of ions based on the depth of the active layer 130 may be measured by a depth profile (ToF-SIMS) that uses a Time of Flight Secondary Ion Mass Spectrometry (ToF-SIMS), for example.

According to one embodiment of the present disclosure, since the concentration of copper (Cu) is uniform over the entire area of the first active layer 131, a concentration deviation of copper (Cu) for each position is not generated, whereby a performance deviation of the thin film transistor 100 due to the concentration deviation of the copper (Cu) may be avoided. For example, an artificial defect generated at a boundary portion between the first active layer 131 and the second active layer 132 may be uniform over the entire area of a channel portion 130n due to copper (Cu) ions. As a result, a current deviation for each position may be prevented from occurring in the channel portion 130n, and driving stability of the thin film transistor 100 may be improved.

In addition, even in the case that a plurality of thin film transistors 100 are disposed on a large-sized substrate 110, the performance deviation of the thin film transistor 100 for each position may be avoided to make sure of uniformity in performance of the thin film transistor 100.

According to one embodiment of the present disclosure, copper (Cu) ions may cause a defect state to increase an s-factor of the thin film transistor 100.

For example, at least a portion of copper (Cu) may be combined with oxygen in the first active layer 131. The copper (Cu) combined with oxygen may exert an effect such as forming an artificial defect in the first active layer 131, and an artificial defect may be also formed in the second active layer 132 that is in contact with the first active layer 131.

The copper (Cu), which may cause an artificial defects, may form an acceptor like trap, thereby increasing the s-factor of the thin film transistor 100.

In more detail, an acceptor like trap may be formed on the surface of the second active layer 132, which is in contact with the first active layer 131, due to the copper ions Cu' included in the first active layer 131. As a result, at a period of a threshold voltage Vth, mobility of carriers (electrons in some types of layers and holes in other types of layers) of the second active layer 132, which is a main channel, may be deteriorated, whereby the s-factor of the thin film transistor 100 may be increased.

According to one embodiment of the present disclosure, since copper is included in the first active layer 131 in a relatively small amount, degradation of current characteristics due to copper (Cu) may not be great. As a result, the s-factor of the thin film transistor 100 may be increased without degradation of electrical characteristics of the thin film transistor 100.

Also, since copper (Cu) may be combined with oxygen to form a stable bond such as CuO, stability of the active layer 130 may be improved. According to one embodiment of the present disclosure, copper (Cu) may be present in a state in which a monovalent ion $Cu^+$ state (e.g., $Cu_2O$) and a divalent ion Cu' state, such as a combination, are mixed. As a result, as compared with the case that copper (Cu) is present only in the divalent ion Cu' state, the probability of phase shift may be reduced, whereby thermodynamic stability may be improved. As a result, variations in the PBTS characteristics of the thin film transistor 100 may be reduced.

Therefore, the thin film transistor 100 according to one embodiment of the present disclosure may have excellent stability as well as the large s-factor.

Considering that the s-factor is improved and current characteristics are prevented from being deteriorated due to the formation of the defect state, the content of the copper (Cu) included in the first active layer 131 may be adjusted.

According to one embodiment of the present disclosure, a ratio of copper based on the entire metal elements in the first active layer 131 may be adjusted to be 5 atomic % (at %) or less.

According to one embodiment of the present disclosure, the atomic % (at %) may be calculated by a ratio of the number of copper (Cu) atoms to a total number of metal atoms constituting the first active layer 131. The total number of metal atoms constituting the first active layer 131 does not include the number of oxygen (O) atoms. The atomic % (at %) of each metal constituting the first active layer 131 may be calculated by a Time of Flight Secondary Ion Mass Spectrometry (ToF-SIMS).

When the ratio of copper based on the entire metal elements in the first active layer 131 exceeds 5 atomic % (at %), the current characteristics and electrical characteristics of the defective thin film transistor 100 may be deteriorated due to excessive defect formation and excessive carrier trap.

Meanwhile, when the concentration of copper (Cu) in the first active layer 131 is less than 0.1 at %, a defect formation and an s-factor increase effect due to copper (Cu) may be rarely exhibited, and stability of the thin film transistor 100 may be slightly improved.

Therefore, according to one embodiment of the present disclosure, the ratio of copper based on the entire metal elements in the first active layer 131 may be adjusted to a range of 0.1 at % to 5.0 at %.

According to one embodiment of the present disclosure, in order to remarkably increase the s-factor of the thin film transistor 100, the ratio of copper based on the entire metal elements in the first active layer 131 may be at least 1.0 at % or more. In addition, in order to improve the current characteristics of the thin film transistor 100 by reducing the carrier trap, the ratio of copper based on the entire metal elements in the first active layer 131 may be adjusted to be 4.0 at % or less, or may be adjusted to 3.0 at % or less.

For example, the ratio of copper based on the entire metal elements in the first active layer 131 may be 1.0 at % to 4.0 at %, may be 1.0 at % to 3.0 at %, or may be 1.5 at % to 2.5 at %.

According to one embodiment of the present disclosure, the active layer 130 may include a channel portion 130*n*, a first connection portion 130*a* and a second connection portion 130*b*. The first connection portion 130*a* and the second connection portion 130*b* may be formed by the selective conductorization of the active layer 130. The first connection portion 130*a* and the second connection portion 130*b* are generally disposed on both sides of the channel portion 130*n*.

The channel portion 130*n* has semiconductor characteristics. The channel portion 130*n* overlaps the light shielding layer 120. The light shielding layer 120 may prevent light incident from the substrate 110 from reaching the channel portion 130*n* of the active layer 130, thereby protecting the channel portion 130*n*. In addition, the channel portion 130*n* overlaps the gate electrode 160.

A gate insulating layer 140 is disposed on the active layer 130. The gate insulating layer 140 may include at least one of silicon oxide (SiOx), silicon nitride (SiNx), hafnium oxide (HfOx), aluminum oxide (AlOx), zirconium oxide (ZrOx), hafnium silicate (Hf-SiOx) or zirconium silicate (Zr-SiOx). The gate insulating layer 140 may have a single layered structure, or may have a multi-layered structure.

A gate electrode 160 is disposed on the gate insulating layer 140. The gate electrode 160 is spaced apart from the active layer 130, and at least partially overlaps the active layer 130. The gate electrode 160 overlaps the channel portion 131 of the active layer 130.

The gate electrode 160 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The gate electrode 160 may have a multi-layered structure that includes at least two conductive layers having their respective physical properties different from each other.

According to one embodiment of the present disclosure, the conductivity of one or more portions of the active layer 130 may be set at a selected level by doping. Namely, different portions of the active layer may be selectively conductorized by selective conductorization using the gate electrode 160 as a mask.

An area of the active layer 130, which is overlapped with the gate electrode 160, is not doped in this step, and thus becomes the channel portion 130n. An area of the active layer 130, which is not overlapped with the gate electrode 160, is conductorized and thus becomes the first connection portion 130a and the second connection portion 130b. If it is desired to set the channel to a selective conductivity or threshold, doping ions can be added in the appropriate process, such processes being well known in the art.

According to one embodiment of the present disclosure, the conductive of the active layer 130 can be set, (namely it may be selectively conductorized) by, for example, a plasma treatment or a dry etch. Also, the active layer 130 may be selectively conductorized by doping using a dopant, or may be selectively conductorized by light irradiation.

An interlayer insulating layer 170 may be disposed on the gate electrode 160. The interlayer insulating layer 170 is an insulating layer made of an insulating material. In detail, the interlayer insulating layer 170 may be made of an organic material, may be made of an inorganic material, or may be made of a stacked body of an organic layer and an inorganic layer.

A source electrode 151 and a drain electrode 152 may be disposed on the interlayer insulating layer 170. The source electrode 151 and the drain electrode 152 are spaced apart from each other and connected to the active layer 130, respectively. The source electrode 151 and the drain electrode 152 may be respectively connected to the first connection portion 130a and the second connection portion 130b of the active layer 130 through a contact hole formed in the interlayer insulating layer 170.

Each of the source electrode 151 and the drain electrode 152 may include at least one of molybdenum (Mo), aluminum (Al), chromium (Cr), gold (Au), titanium (Ti), nickel (Ni), neodymium (Nd), copper (Cu) or their alloy. Each of the source electrode 151 and the drain electrode 152 may be made of a single layer made of a metal or a metal alloy, or may be made of two or more layers.

According to one embodiment of the present disclosure, any one of the first connection portion 130a and the second connection portion 130b may be a source area, and the other one thereof may be a drain area. The source area may serve as a source connection portion connected with the source electrode 151. The drain area may serve as a drain connection portion connected with the drain electrode 152.

The first connection portion 130a and the second connection portion 130b, which are shown in the drawings, are distinguished from each other for convenience of description, and the first connection portion 130a and the second connection portion 130b may be used interchangeably. The first connection portion 130a may be a source area, and the second connection portion 130b may be a drain area. In addition, the first connection portion 130a may be a drain area, and the second connection portion 130b may be a source area.

According to one embodiment of the present disclosure, the first connection portion 130a may serve as a source electrode, or may serve as a drain electrode. In addition, the second connection portion 130b may serve as a drain electrode, or may serve as a source electrode.

A thin film transistor TFT may be formed by the active layer 130, the gate electrode 160, the source electrode 151 and the drain electrode 152.

Figure 3:
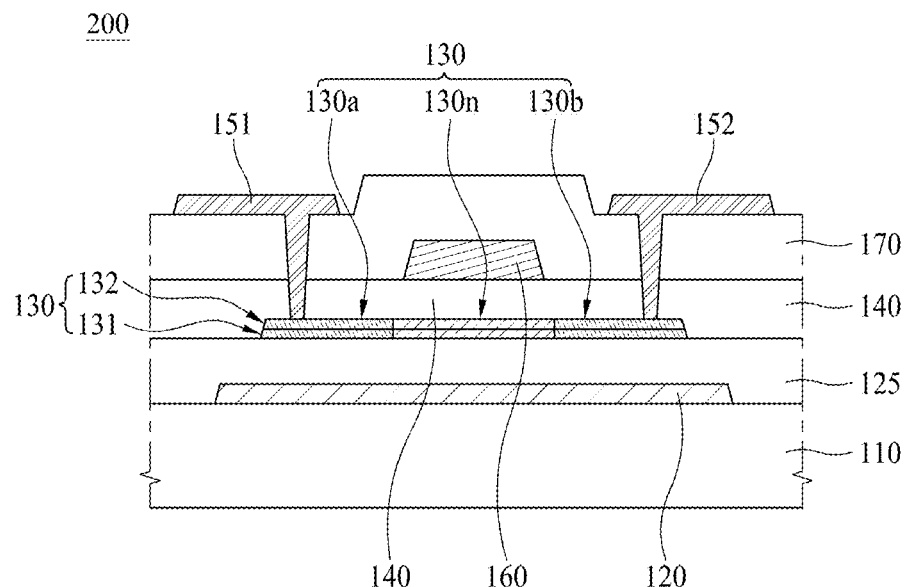
FIG. 3 is a cross-sectional view illustrating a thin film transistor according to another embodiment of the present disclosure.

FIG. 3 is a cross-sectional view illustrating a thin film transistor 200 according to another embodiment of the present disclosure. Hereinafter, in order to avoid redundancy, a description of the elements already described will be omitted.

Referring to FIG. 3, the gate insulating layer 140 is not patterned, and may fully cover the upper surface of the active layer 130. Also, the gate insulating layer 140 may fully cover the upper portion of the substrate 110 except for a contact hole area.

When the gate insulating layer 140 is not patterned and fully covers the upper surface of the active layer 130, the active layer 130 may be selectively conductorized by doping using a dopant. As a result, even though the gate insulating layer 140 is not patterned, the first connection portion 130a and the second connection portion 130b of the active layer 130 may be formed.

Figure 4:
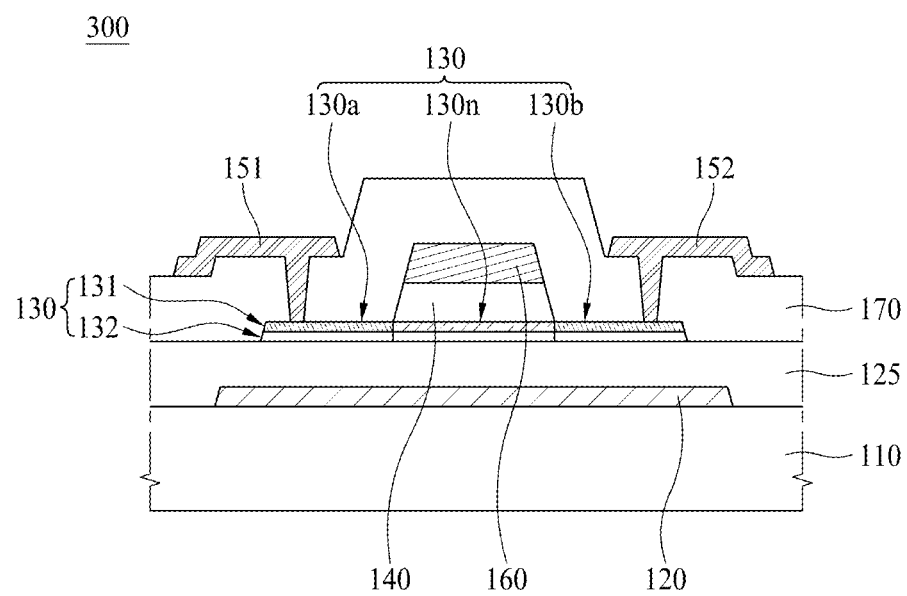
FIG. 4 is a cross-sectional view illustrating a thin film transistor according to still another embodiment of the present disclosure.

FIG. 4 is a cross-sectional view illustrating a thin film transistor 300 according to still another embodiment of the present disclosure.

The thin film transistor 300 of FIG. 4 is different from the thin film transistor 100 of FIG. 1 in that the arrangement positions of the first active layer 131 and the second active layer 132 are different from each other. In the thin film transistor 300 of FIG. 4, the first active layer 131 includes copper (Cu) and the second active layer 132 serves as a main channel layer like the thin film transistor 100 of FIG. 1.

In the thin film transistor 100 of FIG. 1, the first active layer 131 is disposed below the second active layer 132, and the upper surface of the first active layer 131 is in contact with the lower surface of the second active layer 132. On the other hand, in the thin film transistor 300 of FIG. 4, the first active layer 131 is disposed on the second active layer 132, and the lower surface of the first active layer 131 is in contact with the upper surface of the second active layer 132.

Figure 5:
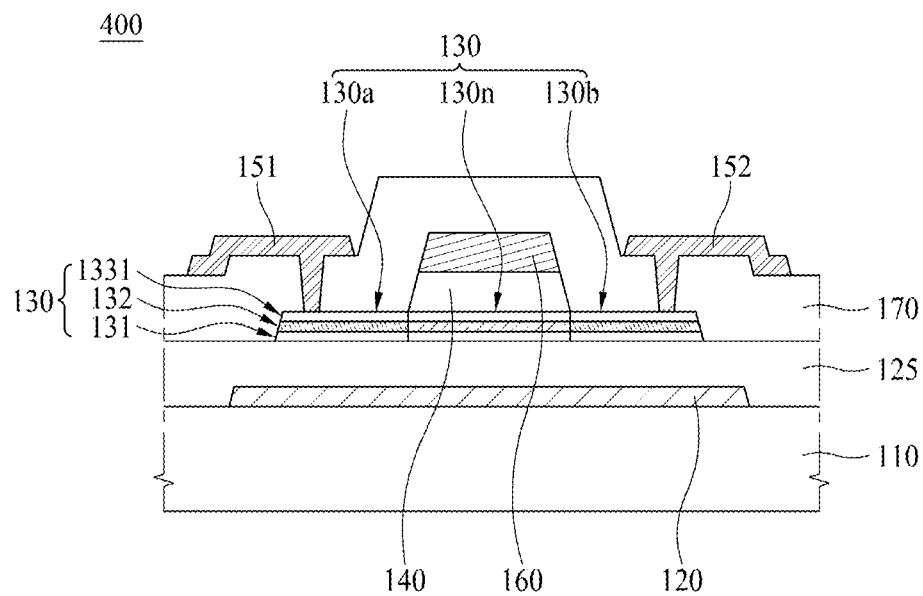
FIG. 5 is a cross-sectional view illustrating a thin film transistor according to further still another embodiment of the present disclosure.

FIG. 5 is a cross-sectional view illustrating a thin film transistor 400 according to further still another embodiment of the present disclosure.

The thin film transistor 400 of FIG. 5 includes a third active layer 1331.

Referring to FIG. 5, the third active layer 1331 is in contact with the second active layer 132. The second active layer 132 serves as a main channel layer, and is disposed between the first active layer 131 and the third active layer 1331.

According to further still another embodiment of the present disclosure, the third active layer 1331 may include copper (Cu).

The third active layer 1331 may have the same metal composition as that of the first active layer 131, but further still another embodiment of the present disclosure is not limited thereto, and the third active layer 1331 may have a different metal composition from that of the first active layer 131.

According to one embodiment of the present disclosure, a ratio of copper based on the entire metal elements in the third active layer 1331 may be adjusted to a range of 0.1 at % to 5.0 at %. In more detail, the ratio of copper based on the entire metal elements in the third active layer 1331 may be 1.0 at % to 4.0 at %, may be 1.0 at % to 3.0 at %, or may be 1.5 at % to 2.5 at %.

Figure 6:
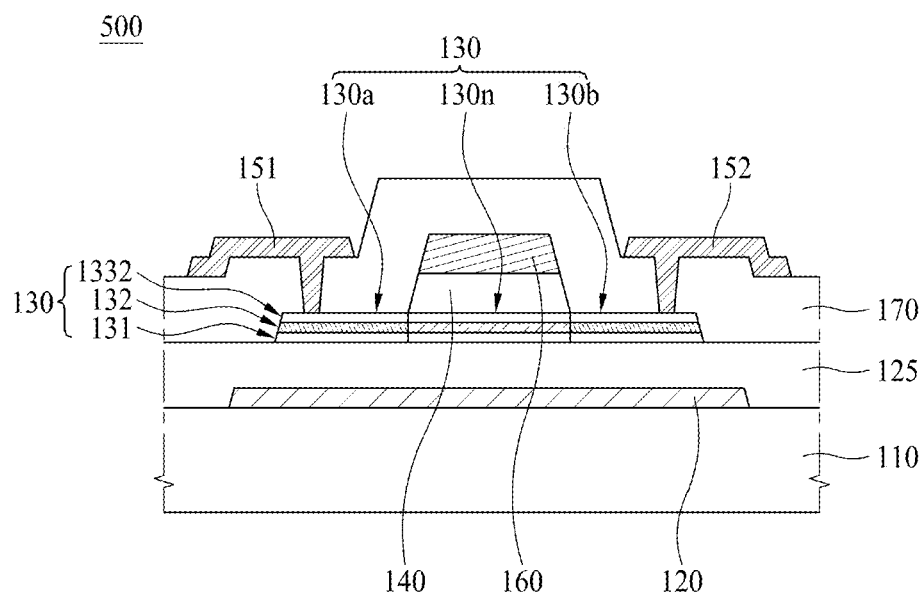
FIG. 6 is a cross-sectional view illustrating a thin film transistor according to further still another embodiment of the present disclosure.

FIG. 6 is a cross-sectional view illustrating a thin film transistor 500 according to further still another embodiment of the present disclosure.

The thin film transistor 500 of FIG. 6 includes a third active layer 1332. Referring to FIG. 6, the third active layer 1332 is in contact with the second active layer 132. The second active layer 132 is disposed between the first active layer 131 and the third active layer 1332.

According to further still another embodiment of the present disclosure, the third active layer 1332 may not include copper (Cu). Based on the second active layer 132, the first active layer 131 including copper (Cu) may be disposed on one side of the second active layer 132, and the third active layer 1332, which does not include copper (Cu), may be disposed on the other side of the second active layer 132.

According to further still another embodiment of the present disclosure, the third active layer 1332 may have mobility lower than that of the second active layer 132. Therefore, the second active layer 132 may serve as a main channel layer.

Since the second active layer 132 serving as the main channel layer is in contact with the first active layer 131 including copper (Cu), an acceptor like trap may be formed on the surface of the second active layer 132 that is in contact with the first active layer 131, and as a result, the s-factor of the thin film transistor 500 may be increased.

Referring to FIG. 6, the first active layer 131, the second active layer 132 and the third active layer 1332 may be sequentially disposed on the substrate 110 in the order of the layers closer to the substrate 110.

Figure 7:
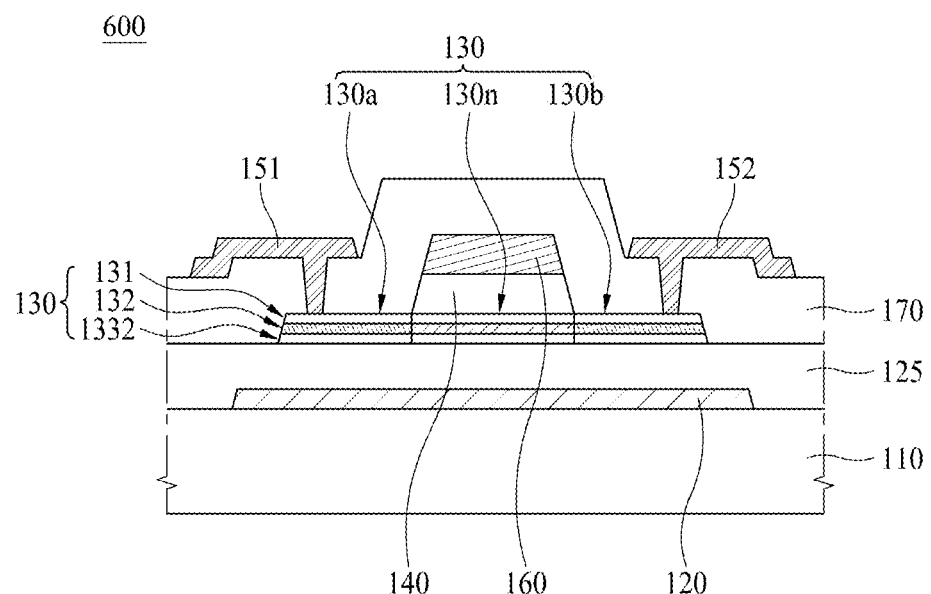
FIG. 7 is a cross-sectional view illustrating a thin film transistor according to further still another embodiment of the present disclosure.

FIG. 7 is a cross-sectional view illustrating a thin film transistor 600 according to further still another embodiment of the present disclosure.

The thin film transistor 600 of FIG. 7 includes a third active layer 1332.

In comparison with the thin film transistor 500 of FIG. 6, in the thin film transistor 600 of FIG. 7, the positions of the first active layer 131 and the third active layer 1332 are different from each other.

Referring to FIG. 7, the third active layer 1332, the second active layer 132 and the first active layer 131 may be sequentially disposed on the substrate 110 in the order of the layers closer to the substrate 110.

Referring to FIG. 7, the third active layer 1332 is in contact with the second active layer 132. The second active layer 132 is disposed between the first active layer 131 and the third active layer 1332.

In the thin film transistor 600 shown in FIG. 7, since the second active layer 132 serving as the main channel layer is in contact with the first active layer 131 including copper (Cu), an acceptor like trap may be formed on the surface of the second active layer 132 that is in contact with the first active layer 131, and as a result, the s-factor of the thin film transistor 500 may be increased.

Figure 8:
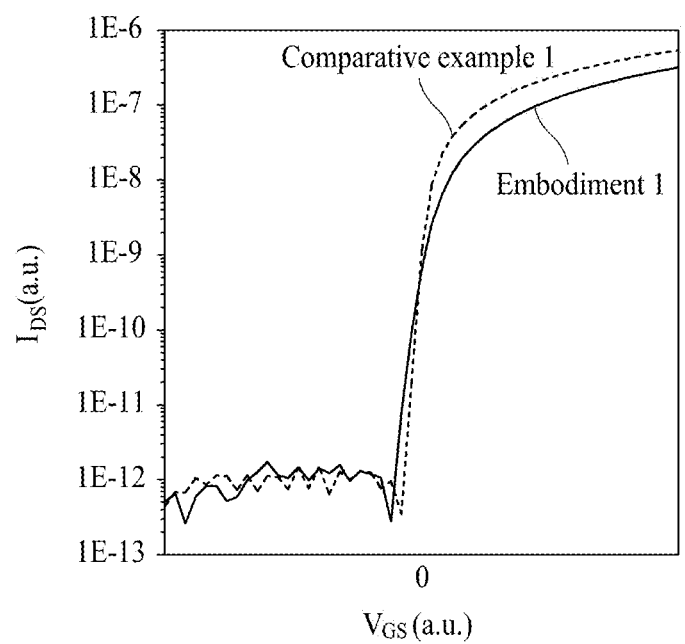
FIG. 8 is a graph illustrating threshold voltages of thin film transistors.

Referring to FIG. 8, the threshold voltage Vth and the s-factor of the thin film transistor will be described with reference to FIG. 8.

FIG. 8 is a graph illustrating threshold voltages of thin film transistors.

In FIG. 8, "Embodiment 1" refers to a threshold voltage graph of the thin film transistor of FIG. 1, which has a first active layer 131 containing copper (Cu). In FIG. 8, "Comparative Example 1" refers to a threshold voltage graph of a thin film transistor having an active layer 130 formed of a single layer without including the first active layer 131 containing copper (Cu).

The threshold voltage graph of FIG. 8 is represented by a value of a drain-source current IDS for a gate voltage VGs of the thin film transistor.

In a drain-source current IDS graph for a gate voltage VGs of the thin film transistor, the s-factor (sub-threshold swing) is obtained by an inverse value of a slope of the graph at a period of a threshold voltage Vth. For example, at the period of the threshold voltage Vth of the thin film transistor, the s-factor may be used as an index indicating a change level of the drain-source current for the gate voltage.

When the s-factor becomes large, a change rate of the drain-source current IDS for the gate voltage at the period of the threshold voltage Vth becomes slow.

FIG. 8 illustrates the drain-source current IDS for the gate voltage VGs. When the s-factor becomes large, since the change rate of the drain-source current IDS for the gate voltage at the period of the threshold voltage Vth becomes slow, it is easy to adjust a magnitude of the drain-source current IDS by adjusting the gate voltage VGS.

In the display device driven by the current, for example, in an organic light emitting display device, a gray scale of a pixel may be controlled by adjusting the magnitude of the drain-source current IDS of the driving thin film transistor that is a driving element. The magnitude of the drain-source current IDS of the driving thin film transistor is determined by the gate voltage. Therefore, in the organic light emitting display device driven by the current, as the s-factor of the driving TFT becomes large, it is easy to adjust the gray scale of the pixel by adjusting the gate voltage.

Referring to FIG. 8, it may be noted that a slope in the threshold voltage graph of the thin film transistor according to Comparative Example 1 is greater than that in the threshold voltage graph of the thin film transistor according to Embodiment 1 in the vicinity of the threshold voltage 0V.

In the vicinity of the threshold voltage 0V, the change rate of the drain-source current IDS of the thin film transistor according to Embodiment 1 is smaller than the change rate of the drain-source current IDS of the thin film transistor according to Comparative Example 1. Therefore, when the thin film transistor according to Embodiment 1 is applied to the display device, the magnitude of the drain-source current IDS may be easily adjusted by controlling the gate voltage, and as a result, the gray scale of the pixel may be easily adjusted.

Figure 9:
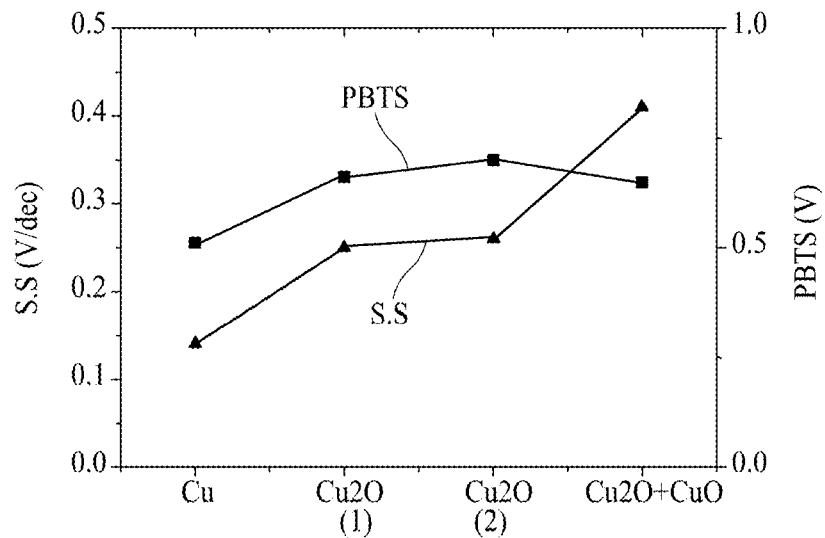
FIG. 9 is a graph illustrating an s-factor and PBTS of a thin film transistor according to a composition of a copper contained in a first active layer.

FIG. 9 is a graph illustrating an s-factor and positive-bias temperature stress (PBTS) of a thin film transistor 100 according to a composition of a copper contained in a first active layer 131.

In FIG. 9, the s-factor is represented by "S.S," and the PBTS is represented by a value V of a threshold voltage variation ΔVth of the thin film transistor 100.

The PBTS means stress under conditions in which a positive (+) bias voltage and a constant temperature are applied. When the PBTS is increased, stress of the oxide semiconductor layer 130 or the thin film transistor 100 is increased, and the threshold voltage variation ΔVth may be increased.

In FIG. 9, x-axis represents an oxidation level of copper. In FIG. 9, the oxidation level is increased from left to right.

"Cu" of FIG. 9 represents the state in which copper is present in the first active layer 131 in a state that copper is not oxidized. "$Cu_2O(1)$" represents the state in which only a portion of copper is oxidized to be present as $Cu^+$ ions, and "$Cu_2O(2)$" represents the state in which the majority of copper is oxidized to be present as $Cu^+$ ions. "$Cu_2O+CuO$" represents that copper is additionally oxidized to be present as a monovalent ion state $Cu^+$ and a divalent ion $Cu^{2+}$ state together.

Referring to FIG. 9, it is noted that as the oxidation level of copper is increased, the s-factor S is increased. In addition, in comparison with the case that copper is present in a monovalent ion $Cu^+$ state, it is noted that as copper is additionally oxidized, PBTS is reduced when monovalent ions $Cu^+$ and divalent ions $Cu^{2+}$ are present together.

Hereinafter, a fabricating method of the thin film transistor 100 according to one embodiment of the present disclosure will be described with reference to FIGS. 10A to 10F.

FIGS. 10A to 10F are fabricating process views of a thin film transistor according to one embodiment of the present disclosure.

Figure 10A:
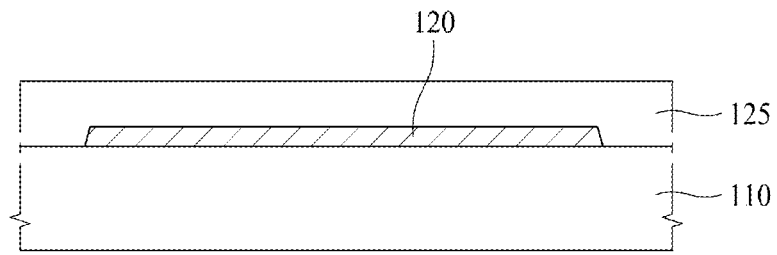
FIGS. 10A to 10F are fabricating process views of a thin film transistor according to one embodiment of the present disclosure.

Referring to FIG. 10A, a light shielding layer 120 may be formed on a substrate 110, and a buffer layer 125 may be formed on the light shielding layer 120.

Figure 10B:
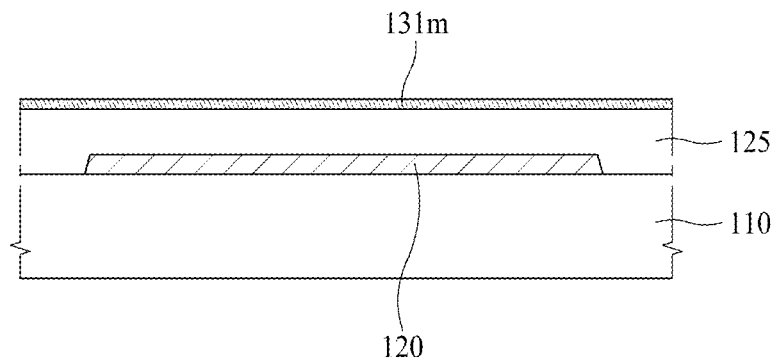
Figure 10C:
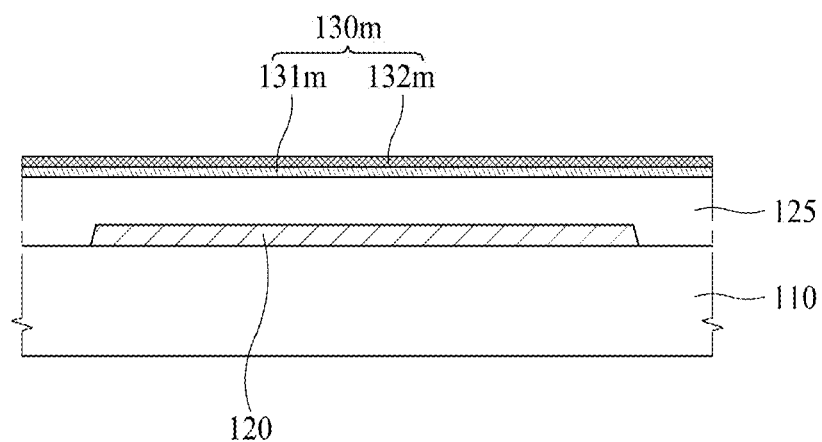

Referring to FIGS. 10B and 10C, an active material layer 130m is formed on the buffer layer 125.

In detail, referring to FIG. 10B, a first active material layer 131m may be formed on the buffer layer 125. The first active material layer 131m includes copper (Cu).

The step of forming the first active material layer 131m may include a sputtering step. According to one embodiment of the present disclosure, the sputtering step may include depositing a raw material.

The raw material for forming the first active material layer 131m may include a metal oxide. The metal oxide used to form the first active material layer 131m by sputtering may include a copper oxide. The first active material layer 131m including copper (Cu) may be formed by sputtering using a raw material including a copper oxide.

According to one embodiment of the present disclosure, the copper oxide for forming the first active material layer 131m may include a cupric oxide (CuO) and a cuprous oxide ($Cu_2O$). According to one embodiment of the present disclosure, a content of CuO may be greater than that of $Cu_2O$ based on the number of Cu atoms. As a result, the first active material layer 131m may mainly include a divalent copper ion Cu' of copper ions.

According to one embodiment of the present disclosure, in the step of forming the first active material layer 131m for forming the first active layer 131, other raw materials and copper (Cu) are used to be mixed together, so that the concentration of copper (Cu) in the first active layer 131 may be entirely uniform.

As described above, in the step of forming the first active material layer 131m by sputtering using the metal oxide as a raw material, copper (Cu) may be uniformly mixed with the other raw material, whereby the first active material layer 131m and the first active layer 131 in which copper (Cu) is dispersed at a uniform concentration may be formed.

Referring to FIG. 10C, a second active material layer 132m is formed on the first active material layer 131m. The second active material layer 132m may be made of a material having mobility higher than that of the material for forming the first active material layer 131m.

Referring to FIG. 10C, as the second active material layer 132m is formed on the first active material layer 131m, the active material layer 130m may be formed.

In FIG. 10C, the first active material layer 131m is illustrated as being disposed below the second active material layer 132m, but one embodiment of the present disclosure is not limited thereto, and the first active material layer 131m may be disposed above the second active material layer 132m.

In addition, according to one embodiment of the present disclosure, the active material layer 130m may further include a third active material layer.

Figure 10D:
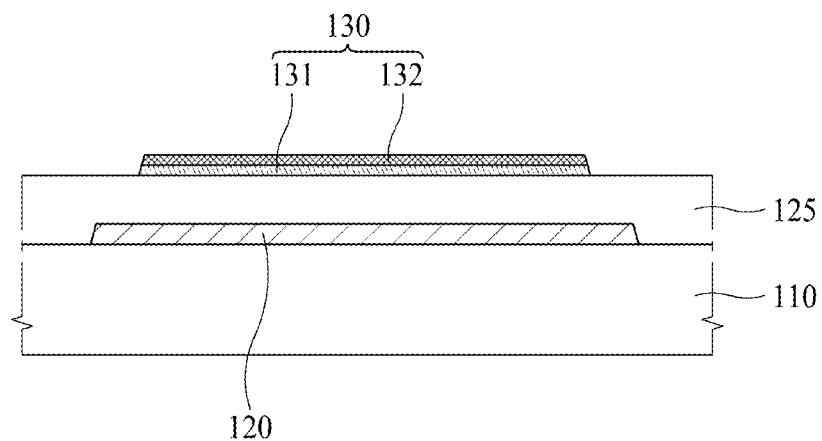

Referring to FIG. 10D, the active material layer 130m is patterned to form the active layer 130.

Figure 10E:
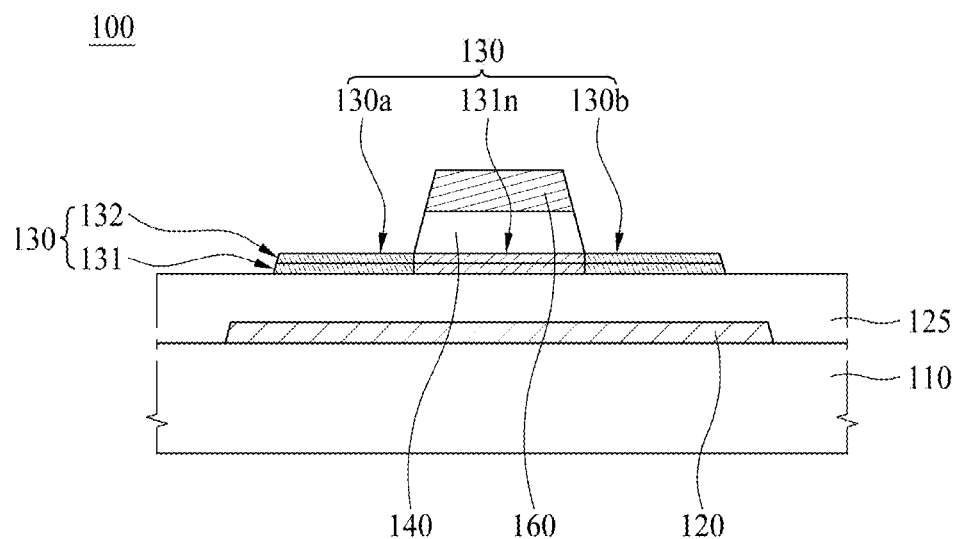

Referring to FIG. 10E, a gate insulating layer 140 may be formed on the active layer 130, and a gate electrode 160 may be formed on the gate insulating layer 140. The gate insulating layer 140 may be patterned.

In addition, the active layer 130 may be selectively conductorized by selective conductorization using the gate electrode 160 as a mask. As a result, an area of the active layer 130, which is overlapped with the gate electrode 160, is not conductorized and thus may become the channel portion 130n, and an area of the active layer 130, which is not overlapped with the gate electrode 160, is conductorized and thus may become the first connection portion 130a and the second connection portion 130b, but one embodiment of the present disclosure is not limited thereto. As shown in FIG. 3, the gate insulating layer 140 is not patterned, and may cover the entire upper surface of the active layer 130. Also, the gate insulating layer 140 may cover the entire upper portion of the substrate 110 except for a contact hole area.

When the gate insulating layer 140 is not patterned and covers the entire upper surface of the active layer 130, the active layer 130 may be selectively conductorized by doping using a dopant. As a result, the first connection portion 130a and the second connection portion 130b of the active layer 130 may be formed even though the gate insulating layer 140 is not patterned.

Figure 10F:
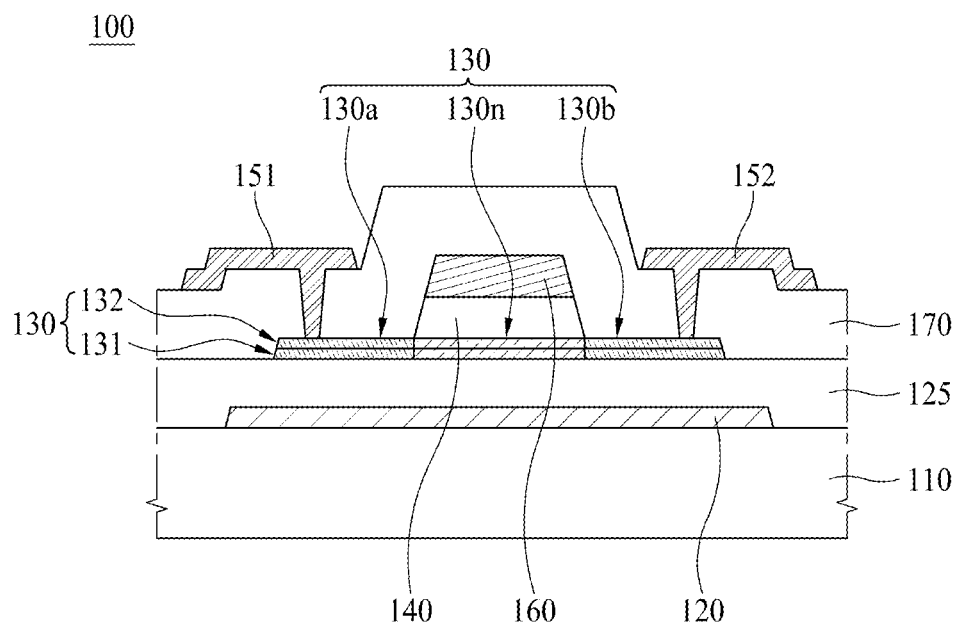

Referring to FIG. 10F, an interlayer insulating layer 170 may be formed on the gate electrode 160, and a source electrode 151 and a drain electrode 152 may be formed on the interlayer insulating layer 170. As a result, the thin film transistor 100 according to one embodiment of the present disclosure may be made.

Figure 11:
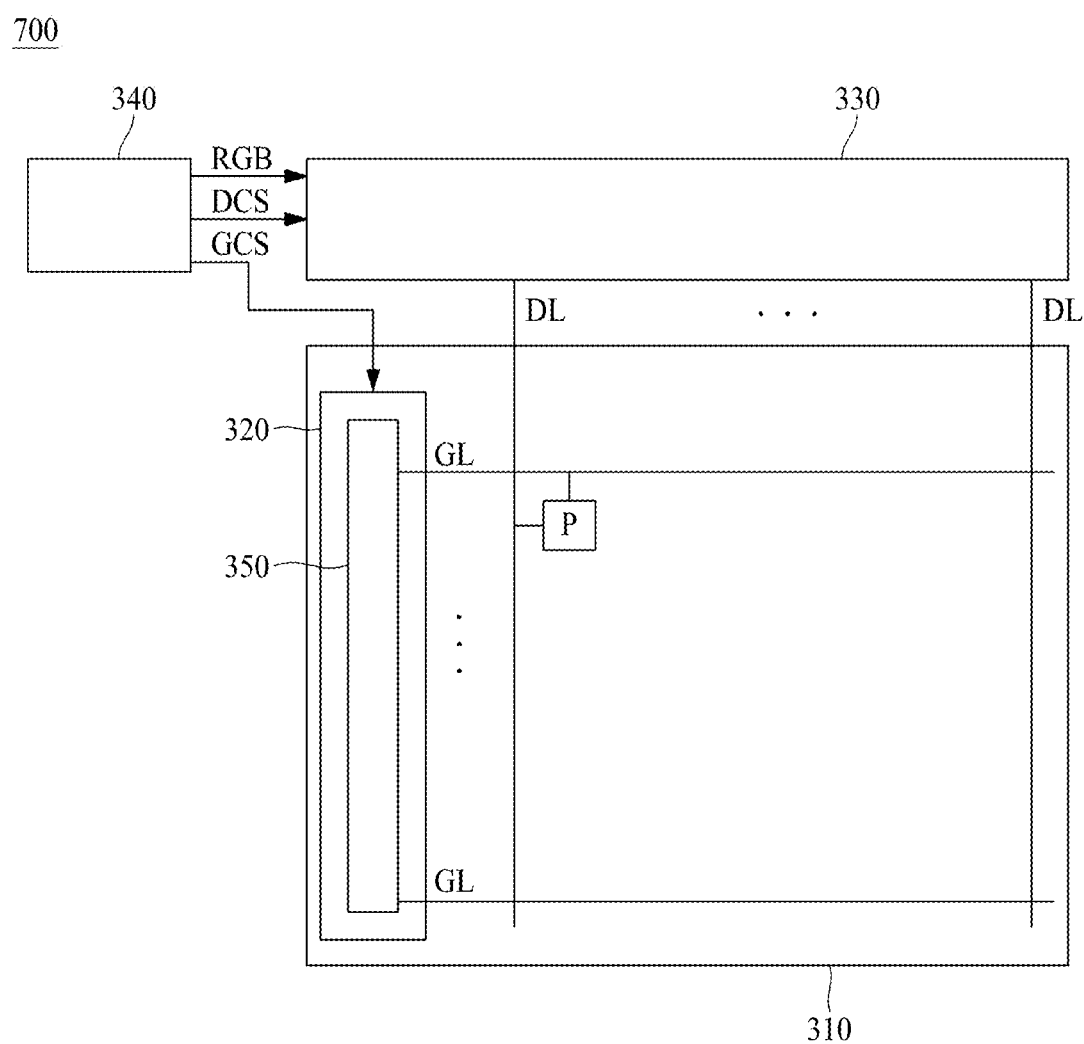
FIG. 11 is a schematic view illustrating a display device according to another embodiment of the present disclosure.

FIG. 11 is a schematic view illustrating a display device 700 according to further still another embodiment of the present disclosure.

As shown in FIG. 11, the display device 700 according to further still another embodiment of the present disclosure includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal that is supplied from an external system (not shown). Also, the controller 340 samples input image data input from the external system, realigns the sampled data, and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage, and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period at which one image is output through the display panel 310. The gate pulse has a turn-on voltage that may turn on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will collectively be referred to as a scan signal SS or Scan.

According to one embodiment of the present disclosure, the gate driver 320 may be packaged on the substrate 110. In this way, a structure in which the gate driver 320 is directly packaged on the substrate 110 will be referred to as a Gate In Panel (GIP) structure.

Figure 12:
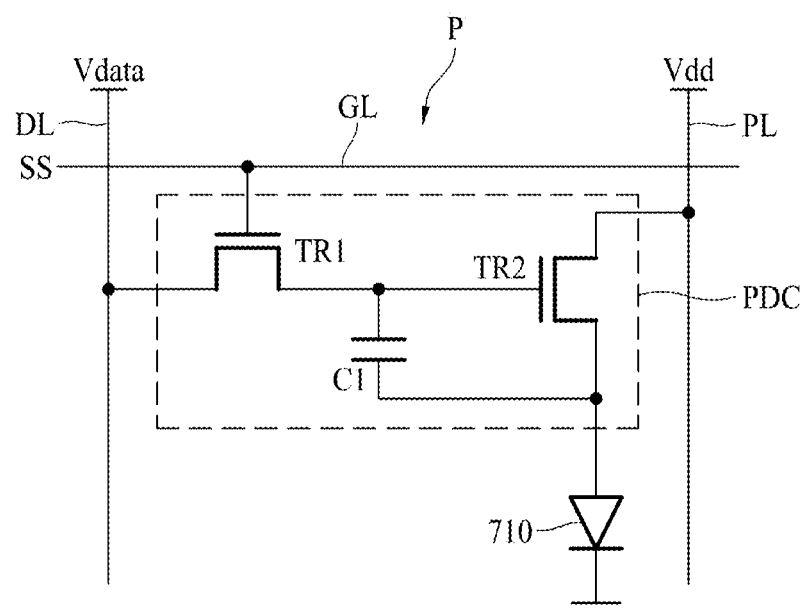
FIG. 12 is a circuit view illustrating any one pixel of FIG. 11.
Figure 13:
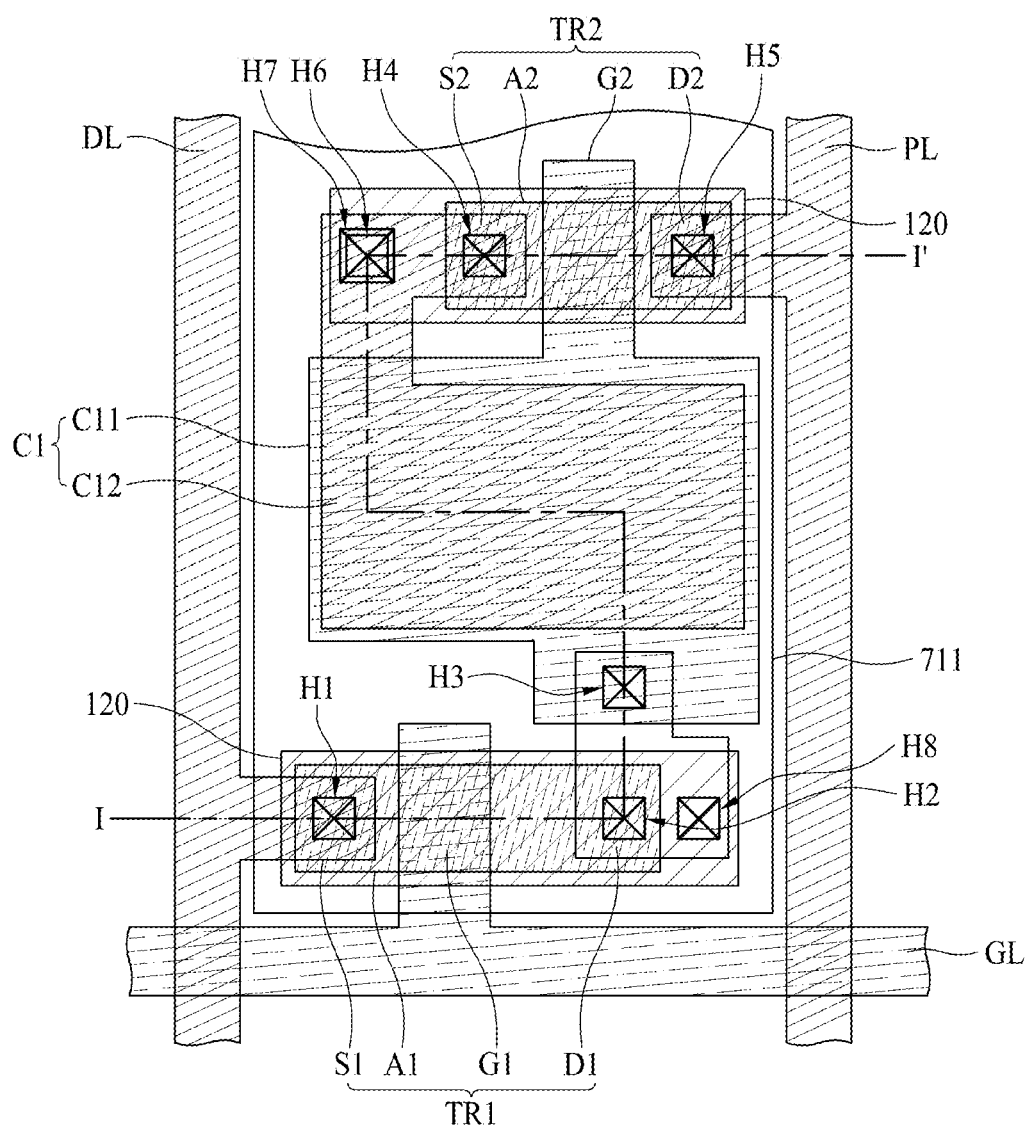
FIG. 13 is a plan view illustrating a pixel of FIG. 12.
Figure 14:
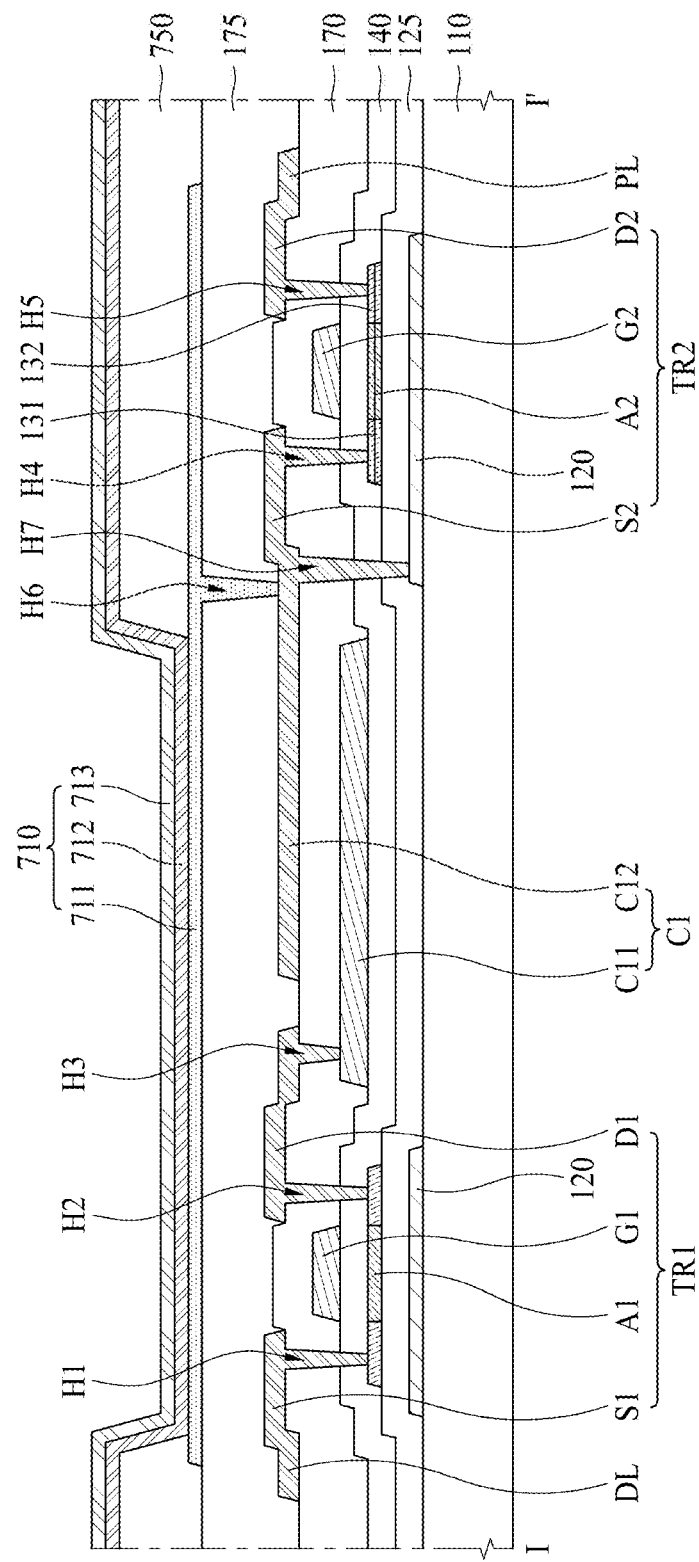
FIG. 14 is a cross-sectional view taken along line I-I' of FIG. 13.

FIG. 12 is a circuit view illustrating any one pixel P of FIG. 11, FIG. 13 is a plan view illustrating a pixel P of FIG. 12, and FIG. 14 is a cross-sectional view taken along line I-I' of FIG. 13.

The circuit view of FIG. 12 is an equivalent circuit view for the pixel P of the display device 700 that includes an organic light emitting diode (OLED) as a display element 710.

The pixel P includes a display element 710 and a pixel driving circuit PDC for driving the display element 710.

The pixel driving circuit PDC of FIG. 12 includes a first thin film transistor TR1 that is a switching transistor and a second thin film transistor TR2 that is a driving transistor. The display device 700 according to further still another embodiment of the present disclosure may include at least one of the thin film transistors 100, 200, 300, 400, 500 and 600 shown in FIGS. 1 and 3 to 7. At least one of the thin film transistors 100, 200, 300, 400, 500 and 600 shown in FIGS. 1 and 3 to 7 may be used as the second thin film transistor TR2 that is a driving transistor.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a first capacitor C1 formed between the gate electrode G2 and a source electrode S2 of the second thin film transistor TR2. The first capacitor C1 is a storage capacitor Cst.

The amount of a current supplied to the organic light emitting diode (OLED), which is the display element 710, through the second thin film transistor TR2 is controlled in accordance with the data voltage Vdata, whereby a gray scale of light emitted from the display element 710 may be controlled.

Referring to FIGS. 13 and 14, the first thin film transistor TR1 and the second thin film transistor TR2 are disposed on the substrate 110.

The substrate 110 may be made of glass or plastic. Plastic having a flexible property, for example, polyimide (PI) may be used as the substrate 110.

A light shielding layer 120 is disposed on the substrate 110. The light shielding layer 120 may shield light incident from the outside to protect active layers A1 and A2.

A buffer layer 125 is disposed on the light shielding layer 120. The buffer layer 125 is made of an insulating material, and protects the active layers A1 and A2 from external water or oxygen. The active layer A1 of the first thin film transistor TR1 and the active layer A2 of the second thin film transistor TR2 are disposed on the buffer layer 125.

Each of the active layers A1 and A2 may include an oxide semiconductor material. According to further still another embodiment of the present disclosure, the active layers A1 and A2 are oxide semiconductor layers made of an oxide semiconductor material. The active layer A2 of the second thin film transistor TR2 may have a stacked structure in which the first active layer 131 and the second active layer 132 are stacked. The second active layer 132 may have mobility higher than that of the first active layer 131. Also, the first active layer 131 may include copper (Cu).

A gate insulating layer 140 is disposed on the active layers A1 and A2. The gate insulating layer 140 has insulation properties, and spaces the active layers A1 and A2 apart from the gate electrodes G1 and G2. The gate insulating layer 140 that is not patterned is shown in FIG. 14, but further still another embodiment of the present disclosure is not limited thereto. The gate insulating layer 140 may be patterned as shown in FIG. 1.

The gate electrode G1 of the first thin film transistor TR1 and the gate electrode G2 of the second thin film transistor TR2 are disposed on the gate insulating layer 140.

The gate electrode G1 of the first thin film transistor TR1 overlaps at least a portion of the active layer A1 of the first thin film transistor TR1.

The gate electrode G2 of the second thin film transistor TR2 overlaps at least a portion of the active layer A2 of the second thin film transistor TR2.

Referring to FIGS. 13 and 14, a first capacitor electrode C11 of the first capacitor C1 is disposed in the same layer as the gate electrodes G1 and G2. The gate electrodes G1 and G2 and the first capacitor electrode C11 may be made together by the same process using the same material.

An interlayer insulating layer 170 is disposed on the gate electrodes G1 and G2 and the first capacitor electrode C11.

The source electrodes S1 and S2 and the drain electrodes D1 and D2 are disposed on the interlayer insulating layer 170. According to one embodiment of the present disclosure, the source electrodes S1 and S2 and the drain electrodes D1 and D2 are only distinguished for convenience of description, and the source electrodes S1 and S2 and the drain electrodes D1 and D2 may be used interchangeably. Therefore, the source electrodes S1 and S2 may be the drain electrodes D1 and D2, and the drain electrodes D1 and D2 may be the source electrodes S1 and S2.

A data line DL and a driving power line PL are disposed on the interlayer insulating layer 170. The source electrode S1 of the first thin film transistor TR1 may be integrally formed with the data line DL. The drain electrode D2 of the second thin film transistor TR2 may be integrally formed with the driving power line PL.

According to one embodiment of the present disclosure, the source electrode S1 and the drain electrode D1 of the first thin film transistor TR1 are spaced apart from each other and connected with the active layer A1 of the first thin film transistor TR1. The source electrode S2 and the drain electrode D2 of the second thin film transistor TR2 are spaced apart from each other and connected with the active layer A2 of the second thin film transistor TR2.

In detail, the source electrode S1 of the first thin film transistor TR1 is in contact with a source area of the active layer A1 through a first contact hole H1.

The drain electrode D1 of the first thin film transistor TR1 is in contact with a drain area of the active layer A1 through a second contact hole H2, and is connected with the first capacitor electrode C11 of the first capacitor C1 through a third contact hole H3. Also, the drain electrode D1 of the first thin film transistor TR1 may be connected with the light shielding layer 120, which overlaps the first thin film transistor TR1, through an eighth contact hole H8.

The source electrode S2 of the second thin film transistor TR2 is extended over the interlayer insulating layer 170, and thus a portion thereof serves as a second capacitor electrode C12 of the first capacitor C1. The first capacitor electrode C11 and the second capacitor electrode C12 are overlapped with each other to form the first capacitor C1.

The source electrode S2 of the second thin film transistor TR2 is in contact with the source area of the active layer A2 through a fourth contact hole H4. Also, the source electrode S2 of the second thin film transistor TR2 may be connected with the light shielding layer 120, which overlaps the second thin film transistor TR2, through a seventh contact hole H7.

The drain electrode D2 of the second thin film transistor TR2 is in contact with the drain area of the active layer A2 through a fifth contact hole H5.

The first thin film transistor TR1 includes an active layer A1, a gate electrode G1, a source electrode S1 and a drain electrode D1, and serves as a switching transistor for controlling the data voltage Vdata applied to the pixel driving circuit PDC.

The second thin film transistor TR2 includes an active layer A2, a gate electrode G2, a source electrode S2 and a drain electrode D2, and serves as a driving transistor for controlling the driving voltage Vdd applied to the display element 710.

A passivation layer 175 is disposed on the source electrodes S1 and S2, the drain electrodes D1 and D2, the data line DL and the driving power line PL. The passivation layer 175 planarizes upper portions of the first thin film transistor TR1 and the second thin film transistor TR2, and protects the first thin film transistor TR1 and the second thin film transistor TR2.

A first electrode 711 of the display element 710 is disposed on the passivation layer 175. The first electrode 711 of the display element 710 is connected with the source electrode S2 of the second thin film transistor TR2 through a sixth contact hole H6 formed in the passivation layer 175.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 14 is an organic light emitting diode (OLED). Therefore, the display device 700 according to further still another embodiment of the present disclosure is an organic light emitting display device.

Figure 15:
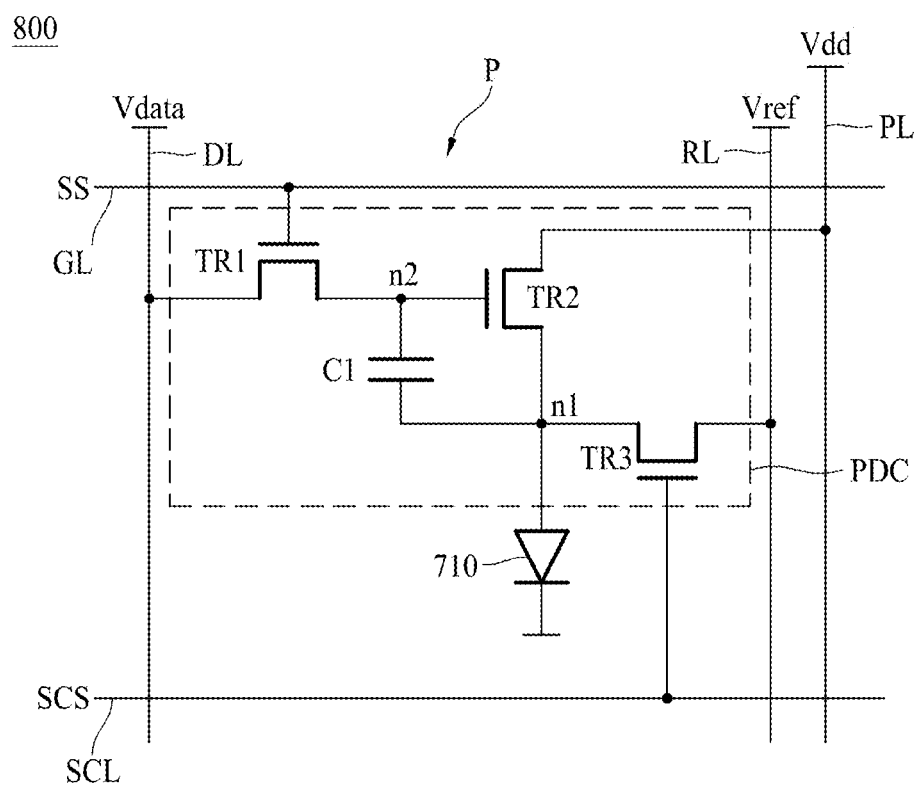
FIG. 15 is a circuit view illustrating a pixel of a display device according to still another embodiment of the present disclosure.

FIG. 15 is a circuit view illustrating a pixel P of a display device 800 according to further still another embodiment of the present disclosure.

FIG. 15 is an equivalent circuit view illustrating a pixel P of an organic light emitting display device.

The pixel P of the display device 800 shown in FIG. 15 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (sensing transistor) for sensing characteristics of the second thin film transistor TR2.

A first capacitor C1 is disposed between the gate electrode G2 of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode G2 of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the first capacitor C1 formed between the gate electrode G2 and the source electrode S2 of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

The display device 800 according to further still another embodiment of the present disclosure may include at least one of the thin film transistors 100, 200, 300, 400, 500 and 600 shown in FIGS. 1 and 3 to 7. Any one of the thin film transistors 100, 200, 300, 400, 500 and 600 shown in FIGS. 1 and 3 to 7 may be used as the second thin film transistor TR2.

Figure 16:
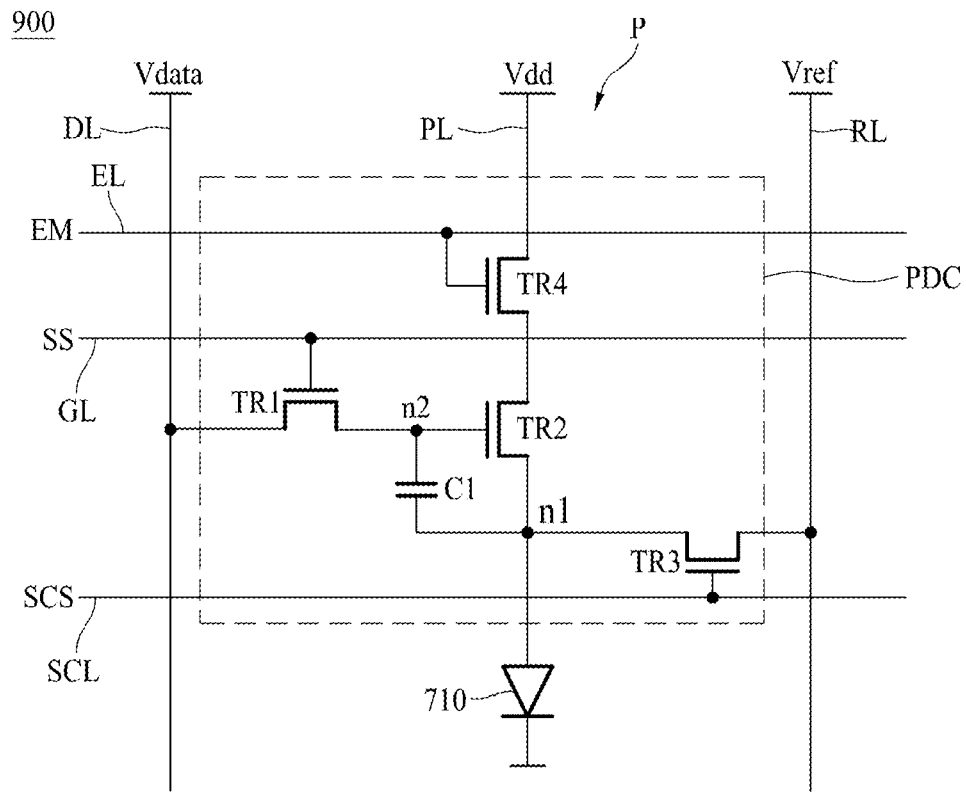
FIG. 16 is a circuit view illustrating a pixel of a display device according to further still another embodiment of the present disclosure.

FIG. 16 is a circuit view illustrating a pixel of a display device 900 according to further still another embodiment of the present disclosure.

The pixel P of the display device 900 shown in FIG. 16 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 15, the pixel P of FIG. 16 further includes an emission control line EL. An emission control signal EM is supplied to the emission control line EL.

Also, the pixel driving circuit PDC of FIG. 16 further includes a fourth thin film transistor TR4 that is an emission control transistor for controlling a light emission timing of the second thin film transistor TR2, in comparison with the pixel driving circuit PDC of FIG. 15.

A first capacitor C1 is positioned between the gate electrode G2 of the second thin film transistor TR2 and the display element 710.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The display device 900 according to further still another embodiment of the present disclosure may include at least one of the thin film transistors 100, 200, 300, 400, 500 and 600 shown in FIGS. 1 and 3 to 7.

The pixel driving circuit PDC according to further still another embodiment of the present disclosure may be formed in various structures in addition to the above-described structure. The pixel driving circuit PDC may include, for example, five or more thin film transistors.

Figure 17:
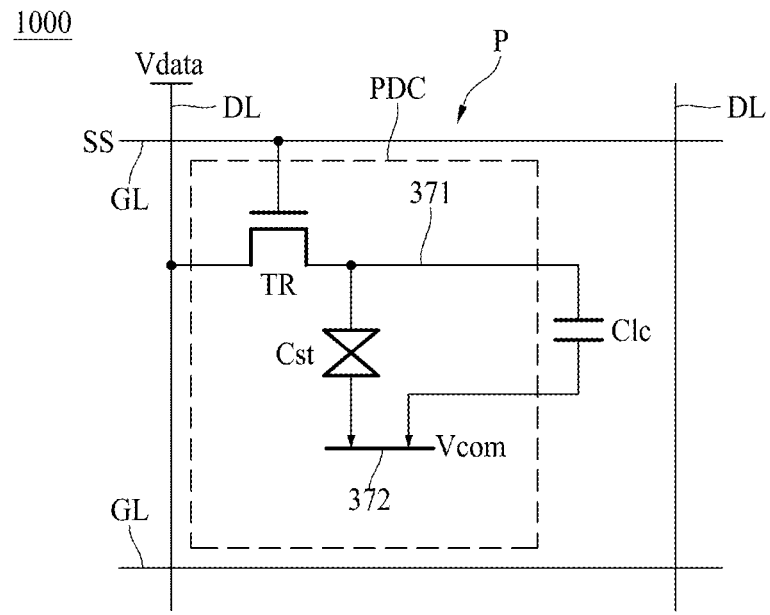
FIG. 17 is a circuit view illustrating a pixel of a display device according to further still another embodiment of the present disclosure.

FIG. 17 is a circuit view illustrating a pixel P of a display device 1000 according to further still another embodiment of the present disclosure.

The display device 1000 of FIG. 17 is a liquid crystal display device.

The pixel P of the display device 1000 shown in FIG. 17 includes a pixel driving circuit PDC and a liquid crystal capacitor C1c connected with the pixel driving circuit PDC. The liquid crystal capacitor C1c corresponds to a display element.

The pixel driving circuit PDC includes a thin film transistor TR connected with the gate line GL and the data line DL and a storage capacitor Cst connected between the thin film transistor TR and a common electrode 372. The liquid crystal capacitor C1c is connected with the storage capacitor Cst in parallel between a pixel electrode 371 and the common electrode 372 of the thin film transistor TR.

The liquid crystal capacitor C1c charges a differential voltage between a data signal supplied to a pixel electrode through the thin film transistor TR and a common voltage Vcom supplied to the common electrode 372, and controls a light-transmissive amount by driving liquid crystals in accordance with the charged voltage. The storage capacitor Cst stably maintains the voltage charged in the liquid crystal capacitor C1c.

The display device 1000 according to further still another embodiment of the present disclosure may include at least one of the thin film transistors 100, 200, 300, 400, 500 and 600 shown in FIGS. 1 and 3 to 7.

According to the present disclosure, the following advantageous effects may be obtained.

The thin film transistor according to one embodiment of the present disclosure includes an active layer having a defect state. The thin film transistor including an active layer having a defect state may have a large s-factor.

The thin film transistor according to one embodiment of the present disclosure may have a large s-factor.

According to one embodiment of this invention, the thin film transistor including an active layer, which is capable of causing a defect state due to copper Cu, may be fabricated.

The thin film transistor according to one embodiment of the present disclosure may be used as a driving element of the display device, and the display device comprising such a thin film transistor may represent an excellent gray scale, and may have excellent display quality.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin film transistor comprising:
   a substrate;
   an active layer overlying the substrate; and
   a gate electrode spaced apart from the active layer and at least partially overlapped with the active layer,
   wherein the active layer includes a first active layer and a second active layer, which overlap each other,
   the first active layer includes copper (Cu), and
   the second active layer has mobility higher than that of the first active layer,
   wherein each of the first active layer and the second active layer includes indium (In), and
   a concentration of the indium (In) in the second active layer is higher than or equal to that of the indium (In) in the first active layer based on the number of atoms as an at % in each respective layer.

2. The thin film transistor of claim 1, wherein a concentration of the copper in the first active layer is uniform.

3. The thin film transistor of claim 1, wherein a ratio of copper based on entire metal elements in the first active layer is 0.1 at % to 5 at %.

4. The thin film transistor of claim 1, wherein each of the first active layer and the second active layer includes an oxide semiconductor material.

5. The thin film transistor of claim 1, wherein the first active layer includes zinc (Zn) and gallium (Ga), and
when a concentration of the zinc (Zn) included in the first active layer is referred to as "[Zn]1" and a concentration of the gallium (Ga) is referred to as "[Ga]1" based on the number of atoms, 0.8≤[Zn]1/[Ga]1≤2 is satisfied.

6. The thin film transistor of claim 1, wherein the copper (Cu) is combined with oxygen (O) to form at least one of CuO or $Cu_2O$.

7. The thin film transistor of claim 1, wherein the copper (Cu) includes at least one of $Cu^+$ or $Cu^{2+}$.

8. The thin film transistor of claim 7, wherein a concentration of $Cu^{2+}$ is higher than that of $Cu^+$.

9. The thin film transistor of claim 1, wherein the active layer further includes a third active layer that is in contact with the second active layer, and
the second active layer is disposed between the first active layer and the third active layer.

10. The thin film transistor of claim 9, wherein the third active layer includes copper (Cu).

11. The thin film transistor of claim 9, wherein the third active layer does not include copper (Cu).

12. A display device comprising:
a substrate;
an active layer overlying the substrate;
a gate insulator adjacent to the active layer;
a gate electrode spaced apart from the active layer and at least partially overlapping the active layer;
an anode electrically coupled to the active layer;
a light emitting layer adjacent to the anode; and
a cathode adjacent to the light emitting layer;
wherein the active layer includes a first active layer and a second active layer, which overlap each other,
wherein the first active layer includes copper (Cu) in the form of at least one of CuO or $Cu_2O$, and
wherein a mobility of charge carriers in the second active layer is higher than a mobility of charge carriers in the first active layer.

13. The display device of claim 12 wherein the gate electrode is above the active layer and the gate insulator overlies an active area and further including:
a light shielding layer below the active area.

14. A thin film transistor comprising:
a substrate;
an active layer overlying the substrate; and
a gate electrode spaced apart from the active layer and at least partially overlapped with the active layer,
wherein the active layer includes a first active layer and a second active layer, which overlap each other,
the first active layer includes copper (Cu), and
the second active layer has mobility higher than that of the first active layer,
wherein the first active layer includes indium (In) and gallium (Ga), and
a concentration of the gallium (Ga) in the first active layer is higher than or equal to that of the indium (In) based on the number of atoms as an at % in each respective layer.

15. The thin film transistor of claim 14, wherein a concentration of the copper in the first active layer is uniform.

16. The thin film transistor of claim 14, wherein a ratio of copper based on entire metal elements in the first active layer is 0.1 at % to 5 at %.

17. The thin film transistor of claim 14, wherein each of the first active layer and the second active layer includes an oxide semiconductor material.

18. The thin film transistor of claim 14, wherein the first active layer includes zinc (Zn) and gallium (Ga), and
when a concentration of the zinc (Zn) included in the first active layer is referred to as "[Zn]1" and a concentration of the gallium (Ga) is referred to as "[Ga]1" based on the number of atoms, 0.8≤[Zn]1/[Ga]1≤2 is satisfied.

19. The thin film transistor of claim 14, wherein the copper (Cu) includes at least one of $Cu^+$ or $Cu^{2+}$.

20. The thin film transistor of claim 19, wherein a concentration of $Cu^{2+}$ is higher than that of $Cu^+$.

* * * * *